United States Patent
Yoon et al.

(10) Patent No.: US 8,409,917 B2
(45) Date of Patent: Apr. 2, 2013

(54) INTEGRATED CIRCUIT PACKAGING SYSTEM WITH AN INTERPOSER SUBSTRATE AND METHOD OF MANUFACTURE THEREOF

(75) Inventors: In Sang Yoon, Ichon-si (KR); HeeJo Chi, Ichon-si (KR); HanGil Shin, Seongnam-si (KR)

(73) Assignee: STATS ChipPAC Ltd., Singapore (SG)

( * ) Notice: Subject to any disclaimer, the term of this patent is extended or adjusted under 35 U.S.C. 154(b) by 12 days.

(21) Appl. No.: 13/053,719

(22) Filed: Mar. 22, 2011

(65) Prior Publication Data

US 2012/0241925 A1    Sep. 27, 2012

(51) Int. Cl.
*H01L 21/00* (2006.01)
(52) U.S. Cl. .......................................... 438/106
(58) Field of Classification Search ............... 438/106
See application file for complete search history.

(56) References Cited

U.S. PATENT DOCUMENTS

| | | | |
|---|---|---|---|
| 6,906,416 B2 | 6/2005 | Karnezos | |
| 7,253,511 B2 | 8/2007 | Karnezos et al. | |
| 7,504,284 B2 | 3/2009 | Ye et al. | |
| 7,554,185 B2 | 6/2009 | Foong et al. | |
| 7,800,212 B2 | 9/2010 | Yoon et al. | |
| 2004/0106229 A1* | 6/2004 | Jiang et al. | 438/106 |
| 2006/0175695 A1 | 8/2006 | Lee | |
| 2008/0237833 A1 | 10/2008 | Hsu et al. | |
| 2009/0115043 A1 | 5/2009 | Chow et al. | |
| 2009/0166835 A1* | 7/2009 | Yang et al. | 257/686 |
| 2009/0236723 A1* | 9/2009 | Bae et al. | 257/686 |
| 2010/0320583 A1* | 12/2010 | Camacho et al. | 257/686 |
| 2011/0074002 A1* | 3/2011 | Hoang et al. | 257/686 |

\* cited by examiner

*Primary Examiner* — Charles Garber
*Assistant Examiner* — Andre' C Stevenson
(74) *Attorney, Agent, or Firm* — Ishimaru & Associates LLP

(57) ABSTRACT

A method of manufacturing of an integrated circuit packaging system includes: providing a base substrate; mounting a first die over the base substrate; mounting a second die over the first die; attaching an interposer substrate over the first die with an attachment adhesive therebetween, the interposer substrate having a central cavity and the second die within the central cavity; attaching a lateral interconnect to a second active side away from the first die of the second die and to the interposer substrate; and encapsulating the first die and the second die.

20 Claims, 6 Drawing Sheets

INTEGRATED CIRCUIT PACKAGING SYSTEM WITH AN INTERPOSER SUBSTRATE AND METHOD OF MANUFACTURE THEREOF

TECHNICAL FIELD

The present invention relates generally to an integrated circuit packaging system, and more particularly to a system for an integrated circuit packaging system with an interposer substrate.

BACKGROUND ART

Current semiconductor packaging technology often involves tradeoffs between ease and efficiency of manufacturing on the one hand, and various performance drawbacks on the other. For example, a tremendous market growth for high density and high output/input integrated circuit packages has resulted in a trend for electronic products that are lightweight, smaller in size, multi-functional, and with ever increasing higher speeds. Electronic products such as cell phone base products, global positioning systems (GPS), satellites, communication equipment, consumer products, and a vast line of other similar products are in ever increasing global demand.

There is an important need that exists for parts in the package to become thinner and thinner to reduce the size of the whole package effectively without sacrificing performance and speed.

Attempts have failed to provide a complete solution addressing simplified manufacturing processing, time to market, improved reliability, reduced electrical parts on the circuit boards, and size reductions of the circuit boards with increased functionality, leveragability, and increased product features to the consumer.

Thus, an increasing need remains to reduce parts mounted on the circuit boards while increasing functionality. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in art.

DISCLOSURE OF THE INVENTION

The present invention provides a method of manufacture of an integrated circuit packaging system including: providing a base substrate; mounting a first die over the base substrate; mounting a second die over the first die; attaching an interposer substrate over the first die with an attachment adhesive therebetween, the interposer substrate having a central cavity and the second die within the central cavity; attaching a lateral interconnect to a second active side away from the first die of the second die and to the interposer substrate; and encapsulating the first die and the second die.

The present invention provides an integrated circuit packaging system including: a base substrate; a first die mounted over the base substrate; an attachment adhesive over the first die; an interposer substrate over the attachment adhesive, the interposer substrate having a central cavity; a second die mounted over the first die and in the central cavity; a lateral interconnect attached to a second active side away from the first die of the second die and to the interposer substrate; and an encapsulation around the first die and the second die.

Certain embodiments of the invention have other steps or elements in addition to or in place of those mentioned above. The steps or elements will become apparent to those skilled in art from a reading of the following detailed description when taken with reference to accompanying drawings.

BEST MODE FOR CARRYING OUT THE INVENTION

Figure 1:
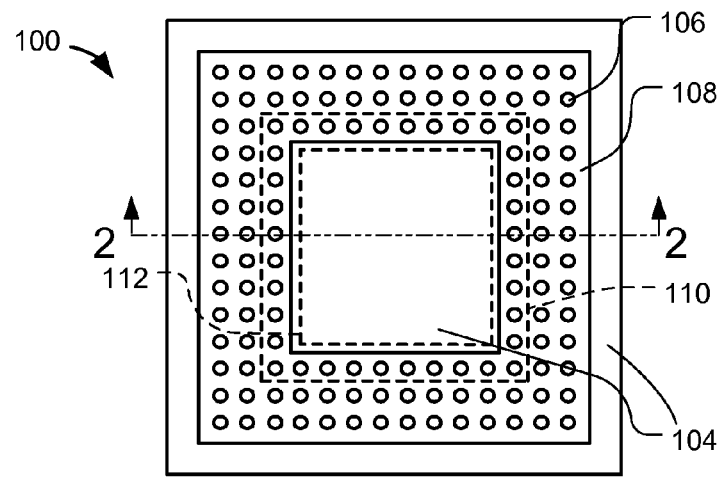
FIG. 1 is a top view of an integrated circuit packaging system in a first embodiment of the present invention.

The following embodiments are described in sufficient detail to enable those skilled in art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of an integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

The term "package-on-package" ("PoP") as used herein includes packaging of devices, where each of the packages can be packaged and tested separately, and then stacked together in package form, wherein at least one package is on top of another.

The term "Fan-In Package-on-Package" ("FiPoP") as used herein making connections between packages by means of a center ball array instead of a peripheral ball array, thereby decoupling the size of the top package from that of the bottom package.

Referring now to FIG. 1, therein is shown a top view of an integrated circuit packaging system 100 in a first embodiment of the present invention. The top view depicts an encapsulation 104 for the integrated circuit packaging system 100. The encapsulation 104 is a protective covering for the integrated circuit packaging system 100, such as an epoxy molding compound.

The integrated circuit packaging system 100 can include an interposer substrate 108. The interposer substrate 108 is a substrate with an electrical interface, such as vias or traces, for routing electrical connections on its upper and lower surfaces. The interposer substrate 108 can have mounting pads 106.

The mounting pads 106 are metal pads for making electrical interconnections external to the integrated circuit packaging system 100, such as a landing pad for external solder balls. The integrated circuit packaging system 100 can also include a first die 110 and a second die 112 underneath the encapsulation 104, illustrated with the labeled dotted lines.

For illustrative purposes, the integrated circuit packaging system 100 is shown with the encapsulation 104 having a square geometric configuration, although it is understood that the encapsulation 104 can have a different geometric configuration. For example, the integrated circuit packaging system 100 can have the encapsulation 104 with a rectangular geometric configuration, or a configuration having non-perpendicular corners.

The integrated circuit packaging system 100 can be attached to a Fan-In Package-on-Package (FiPoP) system. The integrated circuit packaging system 100 can also be attached to an electrical component, a flip chip die or package, a Quad Flat Package (QFP), a Quad Flat No Leads (QFN) package, a Ball Grid Array (BGA) package, or a Land Grid Array (LGA) package.

Figure 2:
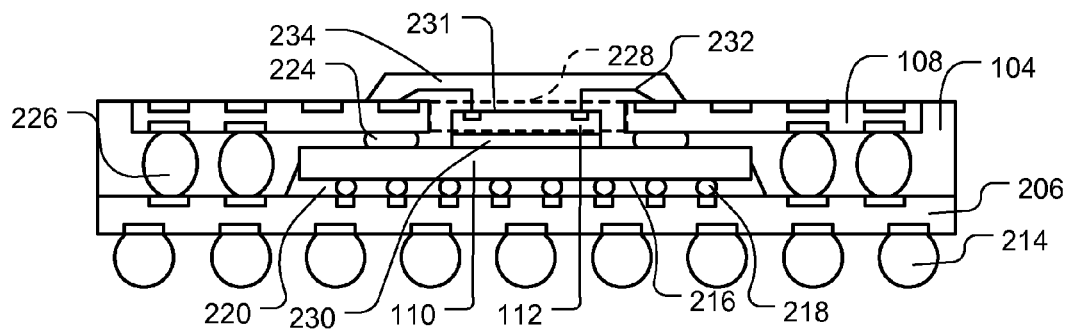
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The integrated circuit packaging system 100 can include the base substrate 206 with bottom external interconnects 214. The base substrate 206 is defined as a chip carrier, such as a laminated substrate or a ceramic substrate. The base substrate 206, for example, can be a substrate with vias. The bottom external interconnects 214 function to provide electrical connections for the integrated circuit packaging system 100 on a bottom side of the integrated circuit packaging system 100.

The integrated circuit packaging system 100 can also include the first die 110 attached to the base substrate 206. For example, the first die 110 can be attached to the base substrate 206 through a flip-chip configuration, and the first die 110 can be a flip-chip die. The first die 110 can have a first active side 216 having active circuitry fabricated thereon. The first active side 216 can be facing the base substrate 206. First interconnects 218, which are electrical connector structures for integrated circuits such as solder balls, can be formed on the first active side 216. The first die 110 can be electrically connected to the base substrate 206 through the first interconnects 218.

For illustrative purposes, the integrated circuit packaging system 100 is shown with the base substrate 206 being larger in surface area than the interposer substrate 108, although it is understood that the relative size can be reversed. For example, the base substrate 206 can have a smaller surface area than the interposer substrate 108.

A first underfill 220 can be applied between the first die 110 and the base substrate 206 for adhering the first die 110 to the base substrate 206. The first underfill 220 can also be applied on the base substrate 206 prior to mounting the first die 110. The first underfill 220 can be, for example, an underfill material or other adhesives. As an illustrative example, the first die 110 is shown to be on the first underfill 220 and the first interconnects 218, and the first underfill 220 and the first interconnects 218 are shown to be on the base substrate 206.

The integrated circuit packaging system 100 can include the interposer substrate 108 attached to the first die 110. The interposer substrate 108 can be attached to the first die 110 with an attachment adhesive 224. The attachment adhesive 224, for example, can be epoxy dots, epoxy or film type adhesive, wire-in-film, or other types of adhesive. The interposer substrate 108 can be supported by base interconnects 226, where the base interconnects 226 are on the base substrate 206, as an example. The base interconnects 226 can be at least solder balls, solder bumps, conductive pillars, or a combination thereof. The base interconnects 226 can be used at least for electrical connection, for structural spacing, for structural support, or a combination thereof.

It has been discovered that the present invention provides the integrated circuit packaging system 100 with reduced package height. Attaching the interposer substrate 108 to the first die 110 with the attachment adhesive 224 serves to eliminate the use of solder bumps to attach the interposer substrate 108 to the first die 110. Solder bumps tend to require a higher vertical spacing, and hence elimination of the use of the solder bumps can provide a lower package height. Attaching the interposer substrate 108 to the first die 110 with the attachment adhesive 224 thereby provides a lower package height.

The interposer substrate 108 can have a central cavity 228. The second die 112 can be within in the central cavity 228. The second die 112 can be partially or completely in the central cavity 228. The second die 112 can be attached to the first die 110 with a second adhesive 230. The second adhesive 230 can be made of the same material the first underfill 220, or can be made of other adhesives, such as an epoxy type adhesive.

The second die 112 can have a second active side 231 having an active circuitry thereon. The second active side 231 can be on the side of the second die 112 away from the second adhesive 230 and the first die 110. Lateral interconnects 232 can be attached to the second die 112 on the second active side 231 and to the interposer substrate 108 to make electrical connections between the two. The lateral interconnects 232 are electrical connector structures for integrated circuits, connecting one component to another component laterally, such as wires or wire bonds.

It has been discovered that the present invention provides the integrated circuit packaging system 100 with a more robust circuitry. The second die 112 mounted away from the first active side 216 of the first die 110 serves to prevent damages to the active circuitry of the first die 110. In a flip chip configuration, the active side of a die is vulnerable to damages. Preventing damages to an active circuitry of a die provides a more robust circuitry. The second die 112 mounted away from the first active side 216 of the first die 110 thereby provides a more robust circuitry.

It has been discovered that the present invention provides the integrated circuit packaging system 100 having very low package stack-up profile. The interposer substrate 108 having the central cavity 228 stacked side by side with the second die 112 serves to provide a lowering of the package profile by utilizing lateral spacing. Utilizing lateral spacing can improve the package stack-up profile by allowing more electrical components to be stacked up vertically because the physical and electrical attachment of the second die 112 did not take up additional vertical space. The interposer substrate 108 having the central cavity 228 stacked side by side with the second die 112 thereby lowers the package stack-up profile.

The integrated circuit packaging system 100 can be encapsulated with the encapsulation 104, surrounding the first die 110, the first underfill 220, the second adhesive 230, the first interconnects 218, the lateral interconnects 232, the base interconnects 226, the second die 112, and the attachment adhesive 224. The bottom external interconnects 214, at least one surface of the base substrate 206 and at least one surface of the interposer substrate 108 can be left either completely or partially exposed from the encapsulation 104. The encapsulation 104 can have a cap protrusion 234 above the second die 112 and the interposer substrate 108. The base substrate 206 and the interposer substrate 108 can be embedded by the encapsulation 104.

It has been discovered that the present invention provides the integrated circuit packaging system 100 with higher stability and improved connectivity. The encapsulation 104 embedding the base substrate 206 and the interposer substrate 108 while exposing at least one surface of each serves to provide stable substrates in the package while providing more input/output (I/O) terminals. Stable substrates and extra I/O terminals can improve stability of the package as well as the connectivity of the package. The encapsulation 104 embedding the base substrate 206 and the interposer substrate 108 while exposing at least one surface of each thereby increases package stability and connectivity.

The cap protrusion 234 is a plateau region of the encapsulation 104 surrounding and encapsulating the lateral interconnects 232. The cap protrusion 234 does not cover the entire top surface of the interposer substrate 108, but leaves part of the interposer substrate 108 exposed. As a specific example, encapsulation is performed with a step mold chase. The step mold chase is able to create the cap protrusion 234 within the encapsulation 104.

It has been discovered that the present invention provides the integrated circuit packaging system 100 having increased stacking capability. The cap protrusion 234 partially covering the interposer substrate 108 serves to provide a lowered package profile around a peripheral of the top surface of the integrated circuit packaging system 100. The cap protrusion 234 can also provide lateral interlocking mechanism with external packages and components. Providing a lowered package profile around a peripheral of the top surface while providing lateral interlocking mechanism with external packages can increase the amount of components or packages to stack with the integrated circuit packaging system 100 without sacrificing reliability. The cap protrusion partially covering the interposer substrate 108 thereby increases the packaging reliability by providing lowered package profile and lateral interlocking mechanism.

Figure 3:
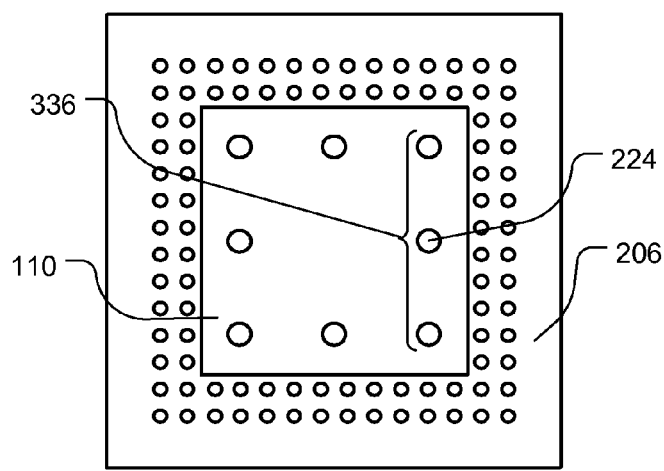
FIG. 3 is a top view of the integrated circuit packaging system in a first die-attach stage of manufacturing.

Referring now to FIG. 3, therein is shown a top view of the integrated circuit packaging system 100 in a first die-attach stage of manufacturing. In the first die-attach stage of manufacturing, the first die 110 is mounted on the first interconnects 218 of FIG. 2 over the base substrate 206. The base substrate 206 can be a laminated substrate or a ceramic substrate with contact pads on both sides of its surfaces.

The first interconnects 218 can be protected by the first underfill 220 of FIG. 2, the first underfill 220 in between the first die 110 and the base substrate 206 around the first interconnects 218. The first die 110 can be in direct contact with the first interconnects 218. The first die 110 can include the first interconnects 218.

The attachment adhesive 224 can be applied on the first die 110. As a specific example, the attachment adhesive 224 can be applied on the first die 110 around a peripheral region 336 of the first die 110, the peripheral region 336 along the periphery of the first die 110 facing away from the base substrate 206. For example, the peripheral region 336 is illustrated as the bracketed area of the first die 110.

For example, the attachment adhesive 224 can be epoxy dots, such as epoxy dots on each corner of the first die 110 and in between corners of the first die 110 as illustrated in FIG. 3. The attachment adhesive 224 can also be epoxy type adhesives or film type adhesives.

As a specific example, the attachment adhesive 224 can be cured during reflow for interposer joining to the base substrate 206 with the base interconnects 226 of FIG. 2. Alternatively, the attachment adhesive 224 can be post cure after the reflow in order to cure the attachment adhesive 224 fully.

Figure 4:
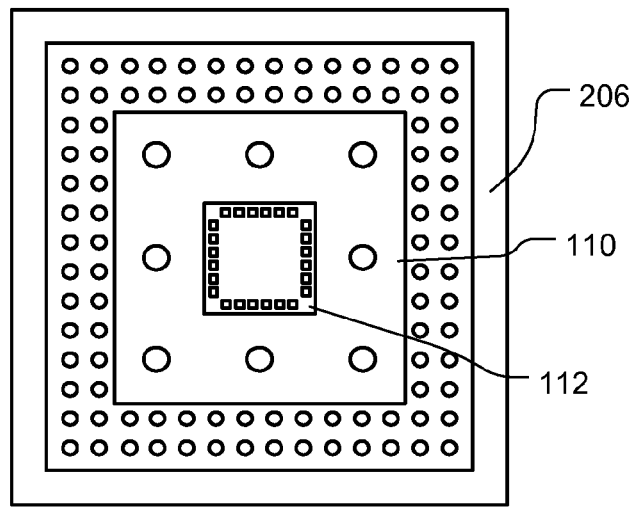
FIG. 4 is a top view of the integrated circuit packaging system in a second die-attach stage of manufacturing.

Referring now to FIG. 4, therein is shown a top view of the integrated circuit packaging system 100 in a second die-attach stage of manufacturing. In the second die-attach stage of manufacturing, the second die 112 is mounted over the first die 110. The second die 112 can be directly on the first die 110. The second die 112 can also be attached to the first die 110 with the second adhesive 230 of FIG. 2, such as an adhesive.

Figure 5:
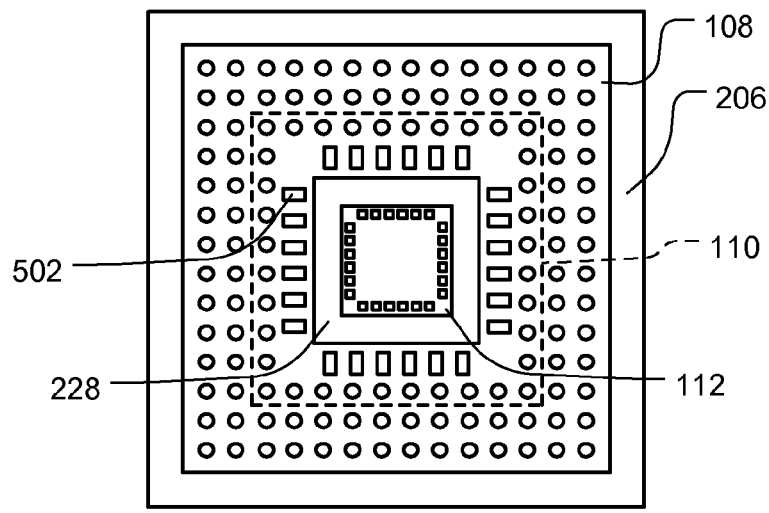
FIG. 5 is a top view of the integrated circuit packaging system in an interposer mounting stage of manufacturing.

Referring now to FIG. 5, therein is shown a top view of the integrated circuit packaging system 100 in an interposer mounting stage of manufacturing. In the interposer mounting stage of manufacturing, the interposer substrate 108 with the central cavity 228 is mounted over the first die 110 (depicted by a dashed square) on the attachment adhesive 224 of FIG. 2. The second die 112 can be within the central cavity 228. Mounting the interposer substrate 108 can include attaching the base interconnects 226 of FIG. 2 to the base substrate 206.

The interposer substrate 108 can have internal pads 502 for making electrical wire connections with the second die 112 within the central cavity 228. For example, the internal pads 502 can be asymmetrical pads to provide a longer bonding surface for making wire bonds. The internal pads 502 can also form a symmetric pattern towards the center of the central cavity 228. The internal pads 502 can also be plated with solder wettable material. The internal pads 502 can be more spaced out than the mounting pads 106 to accommodate for wire connections, which would need a greater clearance to prevent short circuits.

The interposer substrate 108 can also have the mounting pads 106 to make external electrical connections for the integrated circuit packaging system 100. The mounting pads 106 can be circular shaped and different from the internal pads 502 in order to accommodate solder interconnects. The mounting pads 504 can also be plated with solder wettable metal.

The interposer mounting stage of manufacturing can be done prior to the second die-attach stage of manufacturing. In that example, the second die 112 will be first attached to the first die 110, the interposer substrate 108 is then mounted on top of the first die 110 putting the second die 112 within the central cavity 228.

Figure 6:
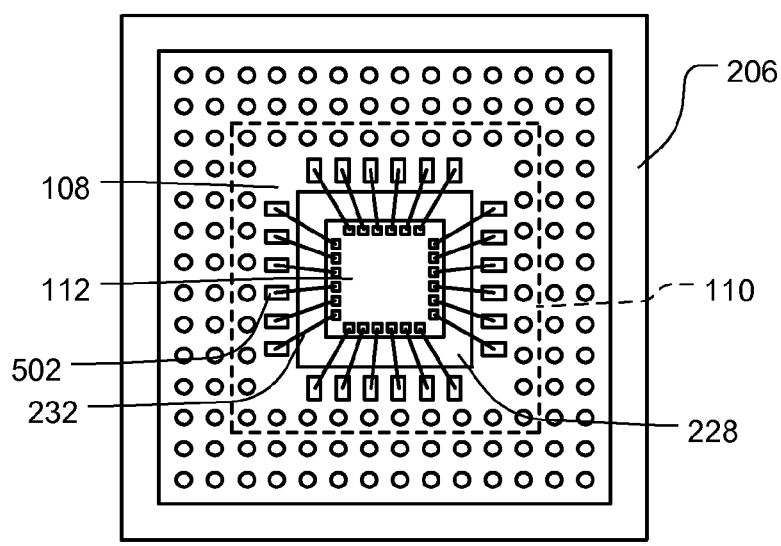
FIG. 6 is a top view of the integrated circuit packaging system in an interconnection stage of manufacturing.

Referring now to FIG. 6, therein is shown a top view of the integrated circuit packaging system 100 in an interconnection stage of manufacturing. In the interconnection stage of manufacturing, the lateral interconnects 232 are formed between the second die 112 and the interposer substrate 108. For example, wire bonds can be made between bonding pads on the second die 112 and bonding pads or the vias on the interposer substrate 108 with the lateral interconnects 232.

As a specific example, the interposer substrate 108 is mounted and electrically connected to the base substrate 206 by the base interconnects 226 of FIG. 2, such as solder balls, and in parallel, the interposer substrate 108 is attached onto the first die 110 by the attachment adhesive 224 of FIG. 2 in the form of epoxy dot adhesives. The interposer substrate 108 can be stacked with side by side stacking against the second die 112 and vertical stacking against the first die 110.

In the specific example, the epoxy dots may be cured during reflow for interposer joining or epoxy dots post cure may be required to cure the epoxy dots fully. The epoxy dots act as overhang support for the lateral interconnects 232. The epoxy dots are spaced to provide mold flowing into the spaces between the epoxy dots. The encapsulation 104 of FIG. 1 can be made by mold flowing into the spaces between epoxy dots. After package encapsulation, the integrated circuit packaging system 100 can further follow connect with external components or packages or further follow package singulation process.

It has been discovered that the present invention provides the integrated circuit packaging system 100 having increased packaging reliability. The attachment adhesive 224 serves to provide overhang support for the lateral interconnects 232 while also providing mold flowing into the spaces between instances of the attachment adhesive 224. The attachment adhesive 224 also serves to provide protection against the base interconnects 226 because the attachment adhesive 224 is under the internal pads 502 such that during the interconnection stage of manufacturing, the force of welding or bonding the lateral interconnects 232 on the internal pads 502 will be absorbed by the attachment adhesive 224. Overhang support, mold support, and base interconnect protection can improve the packaging reliability by protecting each individual components in the integrated circuit packaging system 100. The application of the attachment adhesive 224 for attaching the interposer substrate 108 with the central cavity 228 thereby increases the packaging reliability by providing overhang support, mold support, and base interconnection protection.

Figure 7:
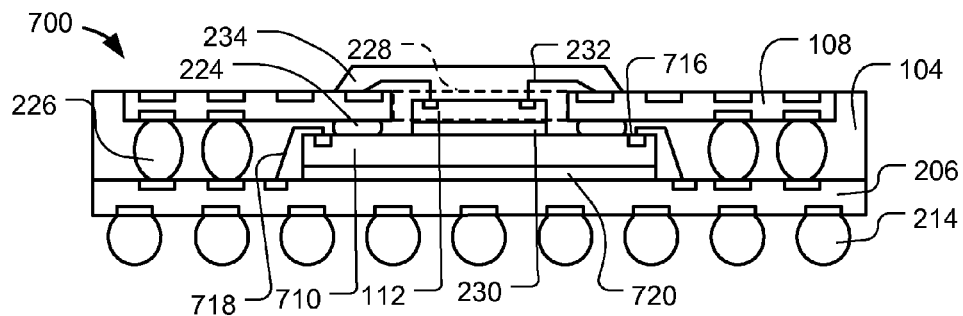
FIG. 7 is a cross-sectional view of an integrated circuit packaging system as exemplified by the top view of FIG. 1 along line 2-2 of FIG. 1 in a second embodiment of the present invention.

Referring now to FIG. 7, therein is shown a cross-sectional view of an integrated circuit packaging system 700 as exemplified by the top view of FIG. 1 along line 2-2 of FIG. 1 in a second embodiment of the present invention. The integrated circuit packaging system 700 can include the base substrate 206 with the bottom external interconnects 214. The integrated circuit packaging system 700 can also include a first die 710 attached to the base substrate 206.

The integrated circuit packaging system 700 can also include the first die 710 attached to the base substrate 206. For example, the first die 710 can be electrically connected to the base substrate 206 through a wire-bond configuration. The first die 710 can have a first active side 716 having active circuitry fabricated thereon. The first active side 716 can be on a side opposite from the base substrate 206. First interconnects 718 can be attached to the first active side 716. The first die 710 can be electrically connected to the base substrate 206 through the first interconnects 718. For example, the first interconnects 718 can be wire bonds made between contact pads on the first active side 716 of the first die 710 and contact pads on the base substrate 206.

A first adhesive 720 can be applied between the first die 710 and the base substrate 206 for adhering the first die 710 to the base substrate 206. The first adhesive 720 can also be applied on the base substrate 206 prior to mounting the first die 710. The first adhesive 720 can be a film adhesive, a tape adhesive, or other kind of adhesives. As an illustrative example, the first die 710 is shown to be on and in direct contact with the first adhesive 720, and the first adhesive 720 is shown to be on and in direct contact with the base substrate 206.

The integrated circuit packaging system 700 can include the interposer substrate 108 attached to the first die 710. The interposer substrate 108 is a substrate with an electrical interface, such as vias or traces, for routing electrical connections on its upper and lower surfaces. The interposer substrate 108 can be attached to the first die 710 with the attachment adhesive 224. The interposer substrate 108 can be supported by the base interconnects 226, where the base interconnects 226 are attached in a double row on the base substrate 206 around the first die 710.

The interposer substrate 108 can have the central cavity 228. The second die 112 can be within the central cavity 228. The second die 112 can be partially or completely in the central cavity 228. The second die 112 can be attached to the first die 710 with the second adhesive 230. The second adhesive 230 can be made of the same material the first adhesive 720, or can be made of other adhesives, such as an epoxy type adhesive. The second die 112 can use the lateral interconnects 232 to make electrical connection with the interposer substrate 108. The lateral interconnects 232 can be, for example, wires or wire bonds.

The integrated circuit packaging system 700 can be encapsulated with the encapsulation 104, surrounding the first die 710, the first adhesive 720, the second adhesive 230, the first interconnects 718, the lateral interconnects 232, the base interconnects 226, the second die 112, and the attachment adhesive 224. The bottom external interconnects 214, at least one surface of the base substrate 206 and at least one surface of the interposer substrate 108 can be left either completely or partially exposed from the encapsulation 104. The encapsulation 104 can have the cap protrusion 234 above the second die 112 and the interposer substrate 108, the interposer substrate 108 around and above the central cavity 228 as shown. The cap protrusion 234 is a plateau region of the encapsulation 104 surrounding and encapsulating the lateral interconnects 232.

Figure 8:
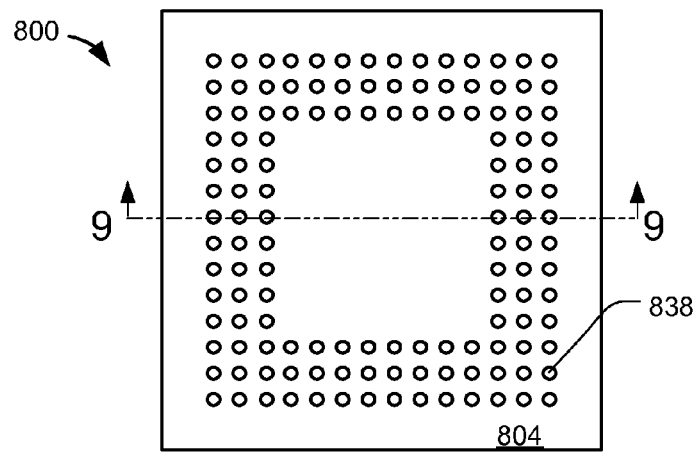
FIG. 8 is a top view of an integrated circuit packaging system in a third embodiment of the present invention.

Referring now to FIG. 8, therein is shown a top view of an integrated circuit packaging system 800 in a third embodiment of the present invention. The top view depicts an encapsulation 804 for the integrated circuit packaging system 800. The encapsulation 804 is a protective covering for the integrated circuit packaging system 100, such as an epoxy molding compound. The encapsulation 804 can leave top external interconnects 838 exposed. The top external interconnects 838 are electrical connector structures for the integrated circuit packaging system 800, such as solder balls. The top surface of the encapsulation 804 containing the top external interconnects 838 can be flat.

It has been discovered that the present invention provides the integrated circuit packaging system 100 having increased stacking flexibility. The top external interconnects 838 serves to provide external interconnection via a flat platform. The bottom external interconnects 214 serves to provide external interconnection to a flat platform. Having both top and bottom surfaces of the integrated circuit packaging system 800 available for external electrical interconnections in the same manner allows multiple instances of the integrated circuit packaging system 800 to be stacked in a chain. Exposing both the top external interconnects 838 in a flat surface and the bottom external interconnects 214 thereby increases the packaging flexibility by providing availability of chain stacking in two directions.

Figure 9:
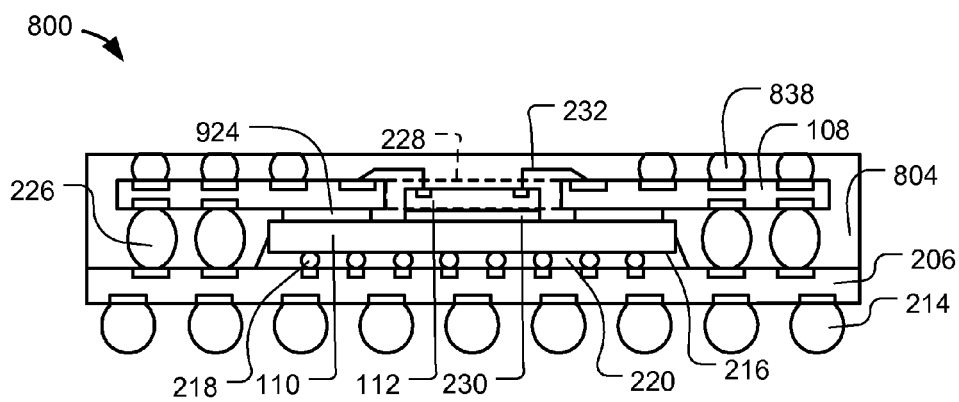
FIG. 9 is a cross-sectional view of the integrated circuit packaging system along line 9-9 of FIG. 8.

Referring now to FIG. 9, therein is shown a cross-sectional view of the integrated circuit packaging system 800 along line 9-9 of FIG. 8. The integrated circuit packaging system 800 can include the base substrate 206 with the bottom external interconnects 214. The integrated circuit packaging system 800 can also include the first die 110 attached to the base substrate 206.

The integrated circuit packaging system 800 can also include the first die 110 attached to the base substrate 206. For example, the first die 110 can be attached to the base substrate 206 through a flip chip configuration. The first die 110 can have the first active side 216. The first active side 216 can be on a side facing the base substrate 206. The first interconnects 218, such as solder balls, can be formed on the first active side 216. The first die 110 can be electrically connected to the base substrate 206 through the first interconnects 218. For example, the first interconnects 218 can be solder ball arrays made between the first active side 216 of the first die 110 and the base substrate 206.

The first underfill 220 can be applied between the first die 110 and the base substrate 206 for adhering the first die 110 to the base substrate 206. The first underfill 220 can also be applied on the base substrate 206 prior to mounting the first die 110. As an illustrative example, the first die 110 is shown to be on and in direct contact with the first interconnects 218 and the first underfill 220, and the first interconnects 218 and the first underfill 220 are shown to be on and in direct contact with the base substrate 206.

The integrated circuit packaging system 800 can include the interposer substrate 108 attached to the first die 110. The interposer substrate 108 is a substrate with an electrical interface, such as vias or traces, for routing electrical connections on its upper and lower surfaces. The interposer substrate 108 can be attached to the first die 110 with the attachment adhesive 924. The attachment adhesive 924 can be an epoxy type adhesive spanning a greater surface area than just an epoxy dot for providing extra structural support for the interposer substrate 108. The interposer substrate 108 can be supported by the base interconnects 226, where the base interconnects 226 are on the base substrate 206.

The interposer substrate 108 can have the central cavity 228. The second die 112 can be within the central cavity 228. The second die 112 can be partially or completely in the central cavity 228. The second die 112 can be attached to the first die 110 with the second adhesive 230. The second adhesive 230 can be made of the same material the first underfill 220, or can be made of other adhesives, such as an epoxy type adhesive. The second die 112 can use the lateral interconnects 232 to make electrical connection with the interposer substrate 108. The lateral interconnects 232 can be, for example, wires or wire bonds.

The top external interconnects 838 can be formed on the interposer substrate 108. The top external interconnects 838 can be, for example, solder balls or solder bumps, or other conductive protrusions. The top external interconnects 838 function to provide external electrical connections for the integrated circuit packaging system 800 on a top side of the integrated circuit packaging system 800.

The integrated circuit packaging system 800 can be encapsulated with the encapsulation 804, surrounding the first die 110, the first underfill 220, the second adhesive 230, the first interconnects 218, the lateral interconnects 232, the base interconnects 226, the second die 112, and the attachment adhesive 924. The bottom external interconnects 214, at least one surface of the base substrate 206 and the top external interconnects 838 can be left either completely or partially exposed from the encapsulation 804.

As a specific example, encapsulation is performed with flat mold chase with Film Assist Mold (FAM) mold or additional encapsulant grinding process to expose the top external interconnects 838 embedded in the encapsulation 804.

Figure 10:
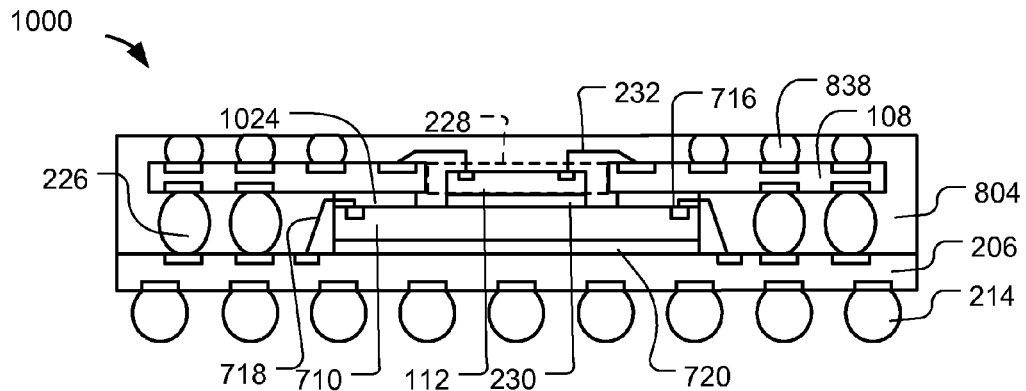
FIG. 10 is a cross sectional view of an integrated circuit packaging system as exemplified by the top view of FIG. 8 along line 9-9 of FIG. 9 in a fourth embodiment of the present invention.

Referring now to FIG. 10, therein is shown a cross-sectional view of an integrated circuit packaging system 1000 as exemplified by the top view of FIG. 8 along line 9-9 of FIG. 9 in a fourth embodiment of the present invention. The integrated circuit packaging system 1000 can include the base substrate 206 with the bottom external interconnects 214. The integrated circuit packaging system 1000 can also include the first die 710 attached to the base substrate 206.

The integrated circuit packaging system 1000 can also include the first die 710 attached to the base substrate 206. For example, the first die 710 can be electrically connected to the base substrate 206 through a wire-bond configuration. The first die 710 can have the first active side 716. The first active side 716 can be on a side opposite from the base substrate 206. The first interconnects 718 can be attached to the first active side 716. The first die 710 can be electrically connected to the base substrate 206 through the first interconnects 718. For example, the first interconnects 718 can be wire bonds made between contact pads on the first active side 716 of the first die 710 and contact pads on the base substrate 206.

The first adhesive 720 can be applied between the first die 710 and the base substrate 206 for adhering the first die 710 to the base substrate 206. The first adhesive 720 can also be applied on the base substrate 206 prior to mounting the first die 710. As an illustrative example, the first die 710 is shown to be on and in direct contact with the first adhesive 720, and the first adhesive 720 is shown to be on and in direct contact with the base substrate 206.

The integrated circuit packaging system 1000 can include the interposer substrate 108 attached to the first die 710. The interposer substrate 108 is a substrate with an electrical interface, such as vias or traces, for routing electrical connections on its upper and lower surfaces.

The interposer substrate 108 can be attached to the first die 710 with the attachment adhesive 1024. The attachment adhesive 1024 can be a wire-in-film adhesive. For example, the first interconnects 718 can be partially within the attachment adhesive 1024. The interposer substrate 108 can be supported by the base interconnects 226, where the base interconnects 226 are on the base substrate 206.

The interposer substrate 108 can have the central cavity 228. The second die 112 can be within the central cavity 228. The second die 112 can be partially or completely in the central cavity 228. The second die 112 can be attached to the first die 710 with the second adhesive 230. The second adhesive 230 can be made of the same material the first adhesive 720, or can be made of other adhesives, such as an epoxy type adhesive. The second die 112 can use the lateral interconnects 232 to make electrical connection with the interposer substrate 108. The lateral interconnects 232 can be, for example, wires or wire bonds.

The top external interconnects 838 can be formed on the interposer substrate 108. The top external interconnects 838 can be, for example, solder balls, solder bumps, or contact pads. The top external interconnects 838 function to provide external electrical connections for the integrated circuit packaging system 1000 on a top side of the integrated circuit packaging system 1000.

The integrated circuit packaging system 1000 can be encapsulated with the encapsulation 804, surrounding the first die 710, the first adhesive 720, the second adhesive 230, the first interconnects 718, the lateral interconnects 232, the base interconnects 226, the second die 112, and the attachment adhesive 1024. The bottom external interconnects 214, at least one surface of the base substrate 206 and the top external interconnects 838 can be left either completely or partially exposed from the encapsulation 804.

Figure 11:
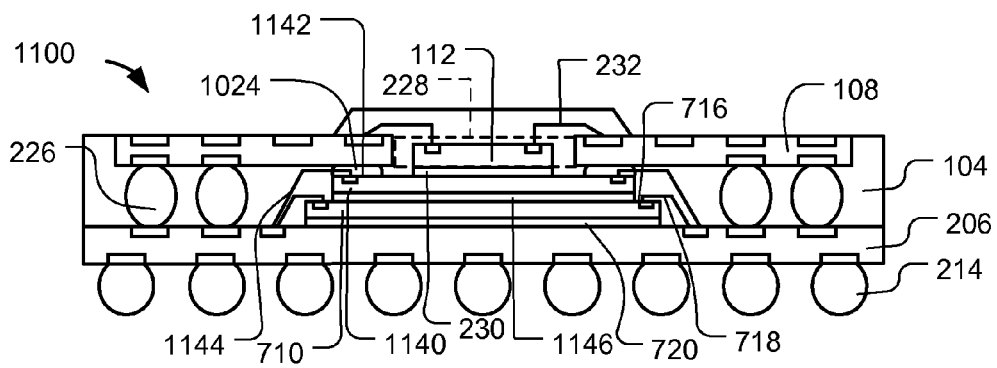
FIG. 11 is a cross-sectional view of an integrated circuit packaging system as exemplified by the top view of FIG. 1 along line 2-2 of FIG. 1 in a fifth embodiment of the present invention.

Referring now to FIG. 11, therein is shown a cross-sectional view of an integrated circuit packaging system 1100 as exemplified by the top view of FIG. 1 along line 2-2 of FIG. 1 in a fifth embodiment of the present invention. The integrated circuit packaging system 1100 can include the base substrate 206 with the bottom external interconnects 214. The integrated circuit packaging system 1100 can also include the first die 710 attached to the base substrate 206.

The integrated circuit packaging system 1100 can also include the first die 710 attached to the base substrate 206. For example, the first die 710 can be electrically connected to the base substrate 206 through a wire-bond configuration. The first die 710 can have the first active side 716. The first active side 716 can be on a side opposite from the base substrate 206. The first interconnects 718 can be attached to the first active side 716. The first die 710 can be electrically connected to the base substrate 206 through the first interconnects 718. For example, the first interconnects 718 can be wire bonds made between contact pads on the first active side 716 of the first die 710 and contact pads on the base substrate 206.

The first adhesive 720 can be applied between the first die 710 and the base substrate 206 for adhering the first die 710 to the base substrate 206. The first adhesive 720 can also be applied on the base substrate 206 prior to mounting the first die 710. As an illustrative example, the first die 710 is shown to be on and in direct contact with the first adhesive 720, and the first adhesive 720 is shown to be on and in direct contact with the base substrate 206.

The integrated circuit packaging system 1100 can include a middle die 1140. For example, the middle die 1140 can be electrically connected to the base substrate 206 through a wire-bond configuration. The middle die 1140 can be attached to the first die 710. For example, the middle die 1140 can have a middle active side 1142 having active circuitry fabricated thereon. The middle active side 1142 can be on a side opposite from the first die 710. Middle interconnects 1144 can be attached to the middle active side 1142. The middle die 1140 can be electrically connected to the base substrate 206 through the middle interconnects 1144. For example, the middle interconnects 1144 can be wire bonds made between the middle active side 1142 of the middle die 1140 and the base substrate 206.

A middle adhesive 1146 can be applied between the middle die 1140 and the first die 710 for adhering the middle die 1140 to the first die 710. The middle adhesive 1146 can be made of the same material the first adhesive 720, or can be made of other adhesives, such as an epoxy type adhesive. The middle adhesive 1146 can also be applied on the first die 710 prior to mounting the middle die 1140. As an illustrative example, the middle die 1140 is shown to be on and in direct contact with the middle adhesive 1146, and the middle adhesive 1146 is shown to be on and in direct contact with the first active side 716 of the first die 710.

The integrated circuit packaging system 1100 can include the interposer substrate 108 attached to the middle die 1140. The interposer substrate 108 is a substrate with an electrical interface, such as vias or traces, for routing electrical connections on its upper and lower surfaces.

The interposer substrate 108 can be attached to the middle die 1140 with the attachment adhesive 1024. The attachment adhesive 1024 can be a wire-in-film adhesive. For example, the middle interconnects 1144 can be partially within the attachment adhesive 1024. The interposer substrate 108 can be supported by the base interconnects 226, where the base interconnects 226 are on the base substrate 206.

The interposer substrate 108 can have the central cavity 228. The second die 112 can be within the central cavity 228. The second die 112 can be partially or completely in the central cavity 228. The second die 112 can be attached on the middle active side 1142 of the middle die 1140 with the second adhesive 230. The second adhesive 230 can be made of the same material the first adhesive 720, or can be made of other adhesives, such as an epoxy type adhesive. The second die 112 can use the lateral interconnects 232 to make electrical connection with the interposer substrate 108. The lateral interconnects 232 can be, for example, wires or wire bonds.

The integrated circuit packaging system 1100 can be encapsulated with the encapsulation 104, surrounding the first die 710, the middle die 1140, the first adhesive 720, the middle adhesive 1146, the second adhesive 230, the first interconnects 718, the lateral interconnects 232, the middle interconnects 1144, the base interconnects 226, the second die 112, and the attachment adhesive 1024. The bottom external interconnects 214, at least one surface of the base substrate 206 and at least one surface of the interposer substrate 108 can be left either completely or partially exposed from the encapsulation 104. The encapsulation 104 can have the cap protrusion 234 above the second die 112 and the interposer substrate 108, the interposer substrate 108 around and above the central cavity 228 as shown in FIG. 11. The cap protrusion 234 is a plateau region of the encapsulation 104 surrounding and encapsulating the lateral interconnects 232.

Figure 12:
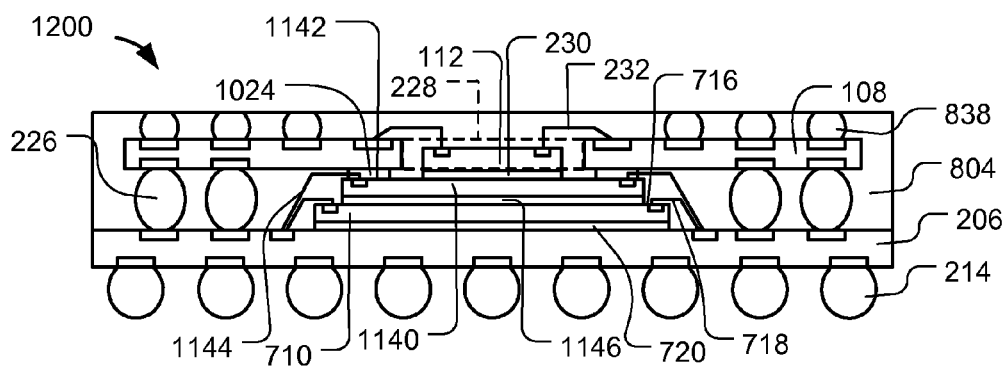
FIG. 12 is a cross-sectional view of an integrated circuit packaging system as exemplified by the top view of FIG. 8 along line 9-9 of FIG. 9 in a sixth embodiment of the present invention.

Referring now to FIG. 12, therein is shown a cross-sectional view of an integrated circuit packaging system 1200 as exemplified by the top view of FIG. 8 along line 9-9 of FIG. 9 in a sixth embodiment of the present invention. The integrated circuit packaging system 1200 can include the base substrate 206 with the bottom external interconnects 214. The integrated circuit packaging system 1200 can also include the first die 710 attached to the base substrate 206.

The integrated circuit packaging system 1200 can also include the first die 710 attached to the base substrate 206. For example, the first die 710 can be electrically connected to the base substrate 206 through a wire-bond configuration. The first die 710 can have the first active side 716. The first active side 716 can be on a side opposite from the base substrate 206. The first interconnects 718 can be attached to the first active side 716. The first die 710 can be electrically connected to the base substrate 206 through the first interconnects 718. For example, the first interconnects 718 can be wire bonds made between contact pads on the first active side 716 of the first die 710 and contact pads on the base substrate 206.

The first adhesive 720 can be applied between the first die 710 and the base substrate 206 for adhering the first die 710 to the base substrate 206. The first adhesive 720 can also be applied on the base substrate 206 prior to mounting the first die 710. As an illustrative example, the first die 710 is shown to be on and in direct contact with the first adhesive 720, and the first adhesive 720 is shown to be on and in direct contact with the base substrate 206.

The integrated circuit packaging system 1200 can include the middle die 1140. For example, the middle die 1140 can be electrically connected to the base substrate 206 through a wire-bond configuration. The middle die 1140 can be attached to the first die 710. For example, the middle die 1140 can have the middle active side 1142. The middle active side 1142 can be on a side opposite from the first die 710. The middle interconnects 1144 can be attached to the middle active side 1142. The middle die 1140 can be electrically connected to the base substrate 206 through the middle interconnects 1144. For example, the middle interconnects 1144 can be wire bonds made between the middle active side 1142 of the middle die 1140 and the base substrate 206.

The middle adhesive 1146 can be applied between the middle die 1140 and the first die 710 for adhering the middle die 1140 to the first die 710. The middle adhesive 1146 can be made of the same material the first adhesive 720, or can be made of other adhesives, such as an epoxy type adhesive. The middle adhesive 1146 can also be applied on the first die 710 prior to mounting the middle die 1140. As an illustrative example, the middle die 1140 is shown to be on and in direct contact with the middle adhesive 1146, and the middle adhesive 1146 is shown to be on and in direct contact with the first die 710.

The integrated circuit packaging system 1200 can include the interposer substrate 108 attached to the middle die 1140. The interposer substrate 108 is a substrate with an electrical interface, such as vias or traces, for routing electrical connections on its upper and lower surfaces.

The interposer substrate 108 can be attached to the middle die 1140 with the attachment adhesive 1024. The attachment adhesive 1024 can be a wire-in-film adhesive. For example, the middle interconnects 1144 can be partially within the attachment adhesive 1024. The interposer substrate 108 can be supported by the base interconnects 226, where the base interconnects 226 are on the base substrate 206.

The interposer substrate 108 can have the central cavity 228. The second die 112 can be within the central cavity 228. The second die 112 can be partially or completely in the central cavity 228. The second die 112 can be attached to the middle die 1140 with the second adhesive 230. The second adhesive 230 can be made of the same material the first adhesive 720, or can be made of other adhesives, such as an epoxy type adhesive. The second die 112 can use the lateral interconnects 232 to make electrical connection with the interposer substrate 108. The lateral interconnects 232 can be, for example, wires or wire bonds.

The top external interconnects 838 can be formed on the interposer substrate 108. The top external interconnects 838 can be, for example, solder balls, solder bumps, or contact pads. The top external interconnects 838 function to provide external electrical connections for the integrated circuit packaging system 1200 on a top side of the integrated circuit packaging system 1200.

The integrated circuit packaging system 1200 can be encapsulated with the encapsulation 804, surrounding the first die 710, the middle die 1140, the first adhesive 720, the middle adhesive 1146, the second adhesive 230, the first interconnects 718, the lateral interconnects 232, the middle interconnects 1144, the base interconnects 226, the second die 112, and the attachment adhesive 1024. The bottom external interconnects 214, at least one surface of the base substrate 206 and the top external interconnects 838 can be left either completely or partially exposed from the encapsulation 804.

Figure 13:
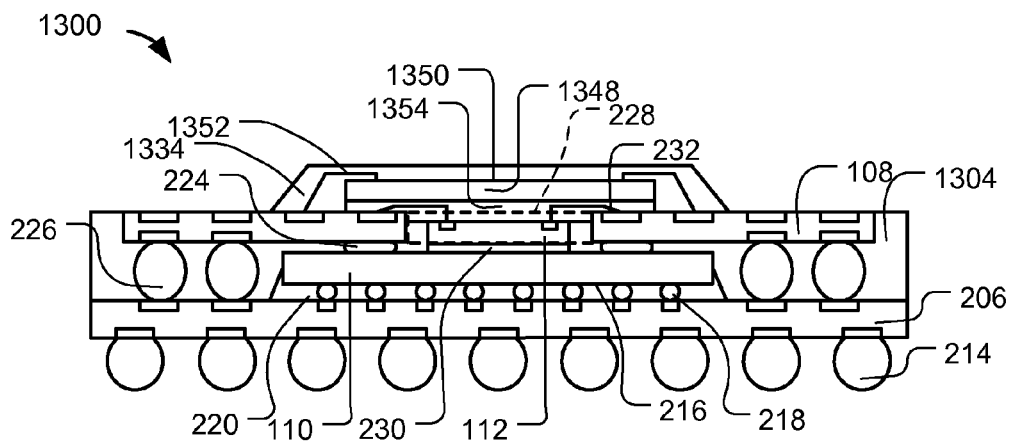
FIG. 13 is a cross-sectional view of an integrated circuit packaging system as exemplified by the top view of FIG. 1 along line 2-2 of FIG. 1 in a seventh embodiment of the present invention.

Referring now to FIG. 13, therein is shown a cross-sectional view of an integrated circuit packaging system 1300 as exemplified by the top view of FIG. 1 along line 2-2 of FIG. 1 in a seventh embodiment of the present invention. The integrated circuit packaging system 1300 can include the base substrate 206 with the bottom external interconnects 214. The base substrate 206, for example, can be a substrate with vias. The bottom external interconnects 214 function to provide electrical connections for the integrated circuit packaging system 1300 on a bottom side of the integrated circuit packaging system 100.

The integrated circuit packaging system 1300 can also include the first die 110 attached to the base substrate 206. For example, the first die 110 can be attached to the base substrate 206 through a flip-chip configuration, and the first die 110 can be a flip-chip die. The first die 110 can have the first active side 216. The first active side 216 can be on a side facing the base substrate 206. The first interconnects 218 can be formed on the first active side 216. The first die 110 can be electrically connected to the base substrate 206 through the first interconnects 218.

The first underfill 220 can be applied between the first die 110 and the base substrate 206 for adhering the first die 110 to the base substrate 206. The first underfill 220 can also be applied on the base substrate 206 prior to mounting the first die 110. As an illustrative example, the first die 110 is shown to be on the first underfill 220 and the first interconnects 218, and the first underfill 220 and the first interconnects 218 are shown to be on the base substrate 206.

The integrated circuit packaging system 1300 can include the interposer substrate 108 attached to the first die 110. The interposer substrate 108 is a substrate with an electrical interface, such as vias or traces, for routing electrical connections on its upper and lower surfaces. The interposer substrate 108 can be attached to the first die 110 with the attachment adhesive 224. The attachment adhesive 224, for example, can be epoxy dots, epoxy or film type adhesive, or other types of adhesive. The interposer substrate 108 can be supported by the base interconnects 226, where the base interconnects 226 are on the base substrate 206. The base interconnects 226 can be at least solder balls, solder bumps, conductive pillars, or a combination thereof.

The interposer substrate 108 can have the central cavity 228. The second die 112 can be within the central cavity 228. The second die 112 can be partially or completely in the central cavity 228. The second die 112 can be attached to the first die 110 with the second adhesive 230. The second adhesive 230 can be made of the same material the first underfill 220, or can be made of other adhesives, such as an epoxy type adhesive. The second die 112 can use the lateral interconnects 232 to make electrical connection with the interposer substrate 108. The lateral interconnects 232 can be, for example, wires or wire bonds.

The integrated circuit packaging system 1300 can further include a top die 1348. The top die 1348 can be electrically connected to the interposer substrate 108 through a wire-bond configuration. The top die 1348 can be attached to the second die 112. For example, the top die 1348 can have a top active side 1350 having active circuitry fabricated thereon. The top active side 1350 can be on a side opposite from the second die 112. Top interconnects 1352 can be attached to the top active side 1350. The top die 1348 can be electrically connected to the interposer substrate 108 through the top interconnects 1352. For example, the top interconnects 1352 can be wire bonds made between the top active side 1350 of the top die 1348 and the interposer substrate 108.

A top adhesive 1354 can be applied between the top die 1348 and the second die 112 for adhering the top die 1348 to the second die 112. The top adhesive 1354 can be made of the same material the first underfill 220, the second adhesive 230, or can be made of other adhesives, such as an epoxy type adhesive. The top adhesive 1354 can also be applied on the second die 112 prior to mounting the top die 1348. The top adhesive 1354 can be a wire-in-film that encapsulating and protecting the lateral interconnects 232. As an illustrative example, the top die 1348 is shown to be on and in direct contact with the top adhesive 1354, and the top adhesive 1354 is shown to be on and in direct contact with the second die 112.

The integrated circuit packaging system 1300 can be encapsulated with an encapsulation 1304, surrounding the first die 110, the first underfill 220, the second adhesive 230, the top adhesive 1354, the first interconnects 218, the lateral interconnects 232, the top interconnects 1352, the base interconnects 226, the second die 112, the top die 1348, and the attachment adhesive 224. The bottom external interconnects 214, at least one surface of the base substrate 206 and at least one surface of the interposer substrate 108 can be left either completely or partially exposed from the encapsulation 1304. The encapsulation 1304 can have the cap protrusion 1334 above the second die 112 and the interposer substrate 108, the interposer substrate 108 around and above the central cavity 228 as shown in FIG. 13. The cap protrusion 1334 is a plateau region of the encapsulation 1304 surrounding and encapsulating the top interconnects 1352, the top die 1348, and the top adhesive 1354.

Figure 14:
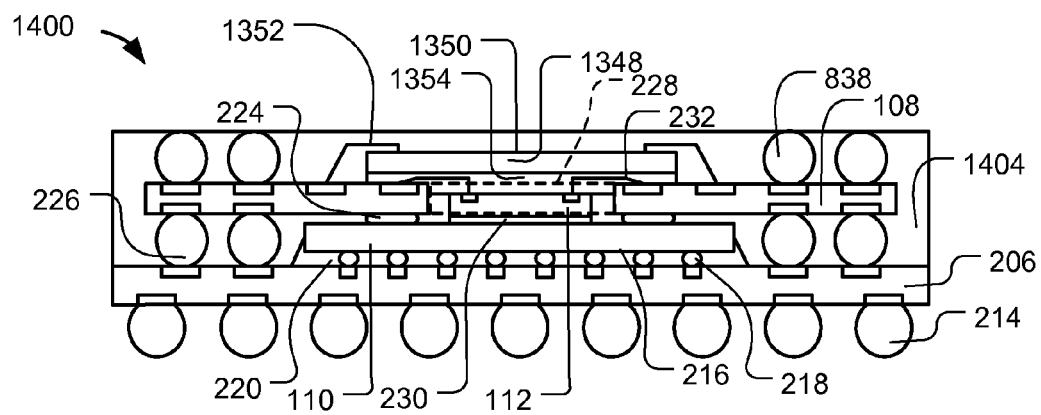
FIG. 14 is a cross-sectional view of an integrated circuit packaging system as exemplified by the top view of FIG. 8 along line 9-9 of FIG. 9 in an eighth embodiment of the present invention.

Referring now to FIG. 14, therein is shown a cross-sectional view of an integrated circuit packaging system 1400 as exemplified by the top view of FIG. 8 along line 9-9 of FIG. 9 in an eighth embodiment of the present invention. The integrated circuit packaging system 1400 can include the base substrate 206 with the bottom external interconnects 214. The base substrate 206, for example, can be a substrate with vias.

The bottom external interconnects 214 function to provide electrical connections for the integrated circuit packaging system 1400 on a bottom side of the integrated circuit packaging system 100.

The integrated circuit packaging system 1400 can also include the first die 110 attached to the base substrate 206. For example, the first die 110 can be attached to the base substrate 206 through a flip-chip configuration, and the first die 110 can be a flip-chip die. The first die 110 can have the first active side 216. The first active side 216 can be on a side facing the base substrate 206. The first interconnects 218 can be formed on the first active side 216. The first die 110 can be electrically connected to the base substrate 206 through the first interconnects 218.

The first underfill 220 can be applied between the first die 110 and the base substrate 206 for adhering the first die 110 to the base substrate 206. The first underfill 220 can also be applied on the base substrate 206 prior to mounting the first die 110. As an illustrative example, the first die 110 is shown to be on the first underfill 220 and the first interconnects 218, and the first underfill 220 and the first interconnects 218 are shown to be on the base substrate 206.

The integrated circuit packaging system 1400 can include the interposer substrate 108 attached to the first die 110. The interposer substrate 108 is a substrate with an electrical interface, such as vias or traces, for routing electrical connections on its upper and lower surfaces. The interposer substrate 108 can be attached to the first die 110 with the attachment adhesive 224. The attachment adhesive 224, for example, can be epoxy dots, epoxy or film type adhesive, or other types of adhesive. The interposer substrate 108 can be supported by the base interconnects 226, where the base interconnects 226 are on the base substrate 206. The base interconnects 226 can be at least solder balls, solder bumps, conductive pillars, or a combination thereof.

The interposer substrate 108 can have the central cavity 228. The second die 112 can be within the central cavity 228. The second die 112 can be partially or completely in the central cavity 228. The second die 112 can be attached to the first die 110 with the second adhesive 230. The second adhesive 230 can be made of the same material the first underfill 220, or can be made of other adhesives, such as an epoxy type adhesive. The second die 112 can use the lateral interconnects 232 to make electrical connection with the interposer substrate 108. The lateral interconnects 232 can be, for example, wires or wire bonds.

The top external interconnects 838 can be formed on the interposer substrate 108. The top external interconnects 838 can be, for example, solder balls, solder bumps, or contact pads. The top external interconnects 838 function to provide external electrical connections for the integrated circuit packaging system 1400 on a top side of the integrated circuit packaging system 1400.

The integrated circuit packaging system 1400 can further include the top die 1348. The top die 1348 can be electrically connected to the interposer substrate 108 through a wire-bond configuration. The top die 1348 can be attached to the second die 112. For example, the top die 1348 can have the top active side 1350. The top active side 1350 can be on a side opposite from the second die 112. The top interconnects 1352 can be attached to the top active side 1350. The top die 1348 can be electrically connected to the interposer substrate 108 through the top interconnects 1352. For example, the top interconnects 1352 can be wire bonds made between the top active side 1350 of the top die 1348 and the interposer substrate 108.

The top adhesive 1354 can be applied between the top die 1348 and the second die 112 for adhering the top die 1348 to the second die 112. The top adhesive 1354 can be made of the same material the first underfill 220, the second adhesive 230, or can be made of other adhesives, such as an epoxy type adhesive. The top adhesive 1354 can also be applied on the second die 112 prior to mounting the top die 1348. The top adhesive 1354 can be a wire-in-film that encapsulating and protecting the lateral interconnects 232. As an illustrative example, the top die 1348 is shown to be on and in direct contact with the top adhesive 1354, and the top adhesive 1354 is shown to be on and in direct contact with the second die 112.

The integrated circuit packaging system 1400 can be encapsulated with an encapsulation 1404, surrounding the first die 110, the top die 1348, the first underfill 220, the top adhesive 1354, the second adhesive 230, the first interconnects 218, the lateral interconnects 232, the top interconnects 1352, the base interconnects 226, the second die 112, and the attachment adhesive 224. The bottom external interconnects 214, at least one surface of the base substrate 206 and the top external interconnects 838 can be left either completely or partially exposed from the encapsulation 1404.

Figure 15:
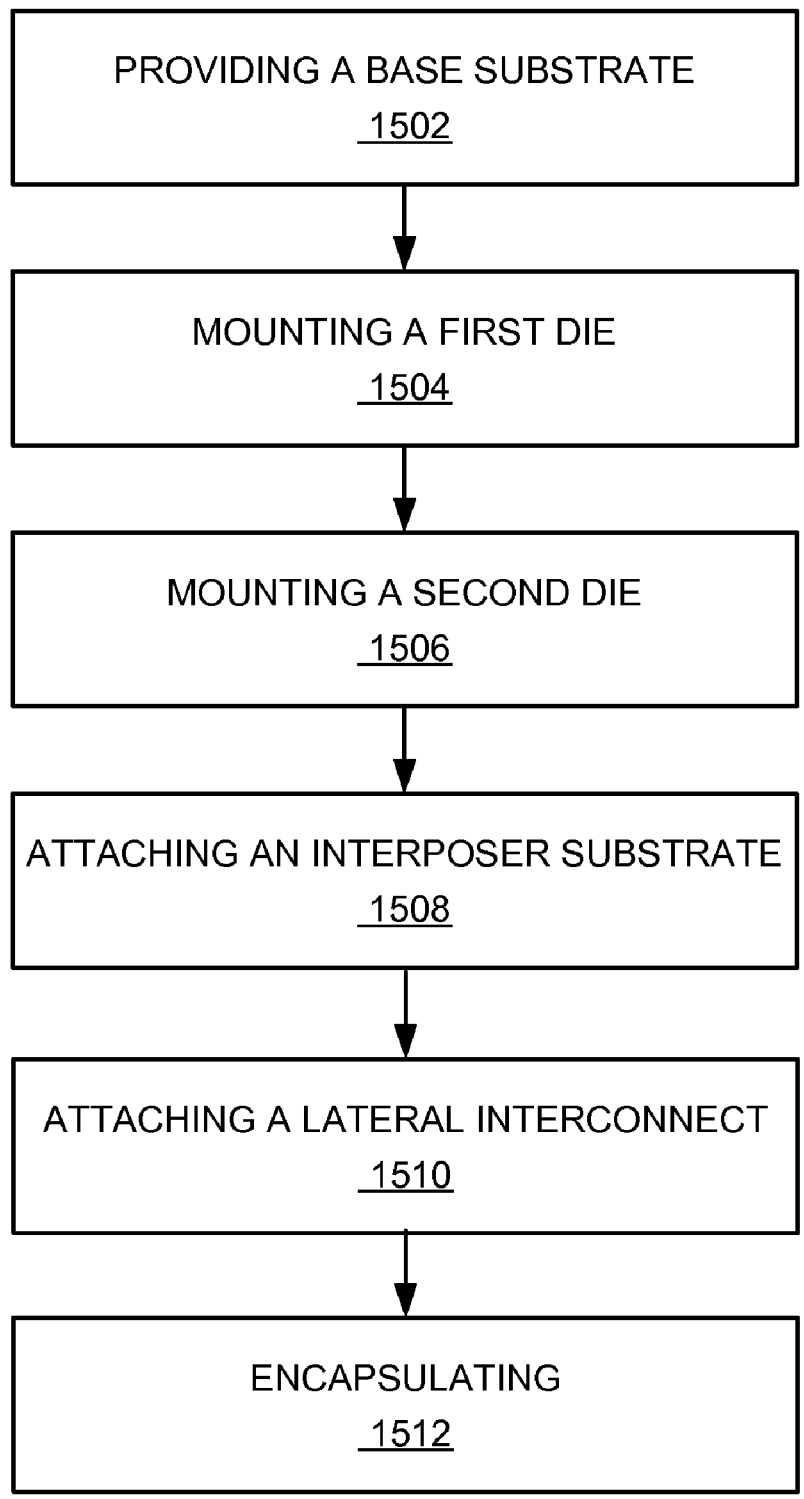
FIG. 15 is a flow chart of a method of manufacture of the integrated circuit packaging system in a further embodiment of the present invention.

Referring now to FIG. 15 therein is shown a flow chart of a method 1300 of manufacture of the integrated circuit packaging system in a further embodiment of the present invention. The method 1500 includes: providing a base substrate, in a block 1502; mounting a first die over the base substrate, in a block 1504; mounting a second die over the first die, in a block 1506; attaching an interposer substrate over the first die with an attachment adhesive therebetween, the interposer substrate having a central cavity and the second die within the central cavity, in a block 1508; attaching a lateral interconnect to a second active side away from the first die of the second die and to the interposer substrate, in a block 1510; and encapsulating the first die and the second die, in a block 1512.

The resulting method, process, apparatus, device, product, and system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in art in light of aforegoing description. Accordingly, it is intended to embrace all such alternatives, modifications, and variations that fall within the scope of the included claims. All matters hitherto fore set forth herein or shown in accompanying drawings are to be interpreted in an illustrative and non-limiting sense.

What is claimed is:

1. A method of manufacture of an integrated circuit packaging system comprising:
    providing a base substrate;
    mounting a first die over the base substrate;
    mounting a middle die on an active side of the first die;
    mounting a second die on a middle active side of the middle die on the active side of the first die;
    attaching base interconnects to the base substrate;
    attaching an interposer substrate over the first die with an attachment adhesive therebetween, the interposer substrate having a central cavity with the second die within the central cavity and the base interconnects connected to the interposer substrate and the base substrate;
    attaching a lateral interconnect to a second active side of the second die away from the first die and to the interposer substrate; and
    encapsulating the base interconnects, the first die, and the second die in a single molding process.

2. The method as claimed in claim 1 wherein encapsulating the first die and the second die includes forming a cap protrusion over the central cavity and covering the lateral interconnect.

3. The method as claimed in claim 1 further comprising encapsulating the middle die.

4. The method as claimed in claim 1 further comprising:
    mounting a top die over the second die and the interposer substrate, the top die having a top interconnects attached the interposer substrate; and
wherein:
    encapsulating the first die and the second die includes encapsulating the top die.

5. The method as claimed in claim 1 wherein attaching the interposer substrate over the first die with the attachment adhesive therebetween includes applying an epoxy dot as the attachment adhesive.

6. A method of manufacture of an integrated circuit packaging system comprising:
    providing a base substrate;
    mounting a first die over the base substrate;
    mounting a middle die on an active side of the first die;
    mounting a second die on a middle active side of the middle die on the active side of the first die;
    attaching base interconnects, to the base substrate, in multiple rows around the first die;
    attaching an interposer substrate over the first die with an attachment adhesive therebetween having a central cavity supported by the base interconnects, the base interconnects on the base substrate and the second die within the central cavity;
    attaching a lateral interconnect to a second active side of the second die away from the first die and to the interposer substrate; and
    encapsulating the base interconnects, the first die, and the second die in a single molding process.

7. The method as claimed in claim 6 wherein encapsulating the first die and the second die includes encapsulating the first die and the second die having at least one surface of the interposer substrate exposed.

8. The method as claimed in claim 6 wherein attaching the interposer substrate over the first die with the attachment adhesive therebetween includes applying the attachment adhesive around a peripheral region of the first die, the peripheral region facing away from the base substrate.

9. The method as claimed in claim 6 further comprising:
    mounting a top external interconnects over the interposer substrate; and
wherein:
    encapsulating the first die and the second die includes encapsulating the first die and the second die having the top external interconnects and the base substrate exposed.

10. The method as claimed in claim 6 wherein attaching the interposer substrate over the first die with the attachment adhesive therebetween having the central cavity supported by the base interconnects for electrical connection and structural spacing.

11. An integrated circuit packaging system comprising:
a base substrate;
a first die mounted over the base substrate;
an attachment adhesive over the first die;
a middle die on an active side of the first die;
base interconnects attached on the base substrate around the first die;
an interposer substrate over the attachment adhesive and coupled to the base interconnects, the interposer substrate having a central cavity;
a second die mounted on a middle active side of the middle die on the active side of the first die and in the central cavity;
a lateral interconnect attached to a second active side of the second die away from the first die and to the interposer substrate; and
a single encapsulation formed on the base interconnects, the first die, and the second die.

12. The system as claimed in claim 11 wherein the encapsulation includes a cap protrusion around the lateral interconnect.

13. The system as claimed in claim 11 wherein the encapsulation surrounds the middle die.

14. The system as claimed in claim 11 further comprising:
a top die mounted over the second die and the interposer substrate, the top die having a top interconnects attached to the interposer substrate; and
wherein:
the encapsulation encapsulates the top die.

15. The system as claimed in claim 11 wherein the attachment adhesive is an epoxy dot.

16. The system as claimed in claim 11 wherein the base interconnects attached on the base substrate includes a double row of the base interconnects around the first die.

17. The system as claimed in claim 16 wherein the encapsulation leaves at least one surface of the interposer substrate exposed.

18. The system as claimed in claim 16 wherein the attachment adhesive is around a peripheral region of the first die, the peripheral region facing away from the base substrate.

19. The system as claimed in claim 16 further comprising:
a top external interconnects mounted on the interposer substrate; and
wherein:
the encapsulation exposes the top external interconnects and the base substrate.

20. The system as claimed in claim 16 wherein the base interconnects are for electrical connection and structural spacing between the interposer substrate and the first die.

* * * * *